(12) United States Patent
Asghari et al.

(10) Patent No.: US 10,305,243 B2
(45) Date of Patent: May 28, 2019

(54) REDUCTION OF MODE HOPPING IN A LASER CAVITY

(71) Applicants: Mehdi Asghari, Pasadena, CA (US); Dazeng Feng, El Monte, CA (US)

(72) Inventors: Mehdi Asghari, Pasadena, CA (US); Dazeng Feng, El Monte, CA (US)

(73) Assignee: Mellanox Technologies Silicon Photonics Inc., Monterey Park, CA (US)

( * ) Notice: Subject to any disclaimer, the term of this patent is extended or adjusted under 35 U.S.C. 154(b) by 659 days.

(21) Appl. No.: 13/573,892

(22) Filed: Oct. 12, 2012

(65) Prior Publication Data
US 2014/0105239 A1  Apr. 17, 2014

Related U.S. Application Data

(60) Provisional application No. 61/627,584, filed on Oct. 14, 2011.

(51) Int. Cl.
*H01S 5/00* (2006.01)
*H01S 3/063* (2006.01)
(Continued)

(52) U.S. Cl.
CPC ............. *H01S 3/063* (2013.01); *H01S 5/141* (2013.01); *H01S 5/028* (2013.01);
(Continued)

(58) Field of Classification Search
CPC ...... H01S 5/141; H01S 5/2201; H01S 5/2202; H01S 5/2027; H01S 3/063;
(Continued)

(56) References Cited

U.S. PATENT DOCUMENTS 5,011,264 A * 4/1991 Bradley .................. G02F 1/035
                                                         359/573
6,101,210 A    8/2000 Bestwick
(Continued)

OTHER PUBLICATIONS

Burnham, et al., Single-Heterojunction Distributed-Feedback GaAs-Diode Lasers, IEEE Journal of Quantum Electronics, Jul. 1975, pp. 439-449.
(Continued)

*Primary Examiner* — Vu A Vu
(74) *Attorney, Agent, or Firm* — Gavrilovich, Dodd & Lindsey, LLP

(57) ABSTRACT

The laser cavity is positioned on a substrate and includes a cavity waveguide guiding a laser light signal between a gain medium and a partial return device. The partial return device receives the laser light signal from the cavity waveguide and returns a first portion of the laser light signal to the cavity waveguide. The partial return device transmits a second portion of the laser light signal to an output waveguide. The partial return device reflects different wavelengths of the laser light signal at different intensities. Additionally, the partial return device is configured such that when the most intense wavelength of the laser light signal reflected by the partial return device is the same as a wavelength of one of modes of the laser light signal, the mode with the next longest wavelength and the mode with the next shortest wavelength are each reflected by the partial return device at an intensity greater than 80% of the intensity of the most intensely reflected wavelength.

20 Claims, 9 Drawing Sheets

(51) Int. Cl.
*H01S 5/14* (2006.01)
*H01S 5/022* (2006.01)
*H01S 5/028* (2006.01)
*H01S 5/0683* (2006.01)

(52) U.S. Cl.
CPC ....... *H01S 5/02248* (2013.01); *H01S 5/02272* (2013.01); *H01S 5/0683* (2013.01)

(58) Field of Classification Search
CPC ............. H01S 3/08018; H01S 3/08059; H01S 3/08063; H01S 3/08086; H01S 3/107
USPC ...................................................... 372/50.11
See application file for complete search history.

(56) References Cited

U.S. PATENT DOCUMENTS

| | | | |
|---|---|---|---|
| 6,944,192 B2* | 9/2005 | Prassas et al. ..................... | 372/6 |
| 6,947,463 B2* | 9/2005 | Tsukiji et al. .............. | 372/50.11 |
| 6,978,057 B1 | 12/2005 | O'Gorman | |
| 2002/0146047 A1 | 10/2002 | Bendett | |
| 2003/0035449 A1* | 2/2003 | Tomlinson et al. ........ | 372/29.02 |
| 2003/0086647 A1 | 5/2003 | Willner | |
| 2003/0133478 A1* | 7/2003 | Sidorin ........................... | 372/20 |
| 2006/0002443 A1* | 1/2006 | Farber ..................... | H01S 5/141 |
| | | | 372/50.1 |
| 2007/0047599 A1* | 3/2007 | Wysocki et al. ................ | 372/20 |
| 2009/0092160 A1 | 4/2009 | Hunter | |
| 2010/0142567 A1 | 6/2010 | Ward | |
| 2011/0027926 A1* | 2/2011 | Hatori et al. .................... | 438/31 |
| 2011/0053095 A1* | 3/2011 | Sakuma et al. .............. | 430/321 |
| 2011/0267676 A1* | 11/2011 | Dallesasse ............. | H01S 5/021 |
| | | | 359/279 |
| 2012/0057610 A1* | 3/2012 | Dallesasse et al. ............. | 372/20 |

OTHER PUBLICATIONS

Chan, et al., Characterisation of Integrated Bragg Gratings on Silicon-On-Insulator Rib Waveguides, Proceedings of SPIE vol. 5248 (2003) pp. 273-283.

Giuntoni, et al., Deep-UV Technology for the Fabrication of Bragg Gratings on SOI Rib Waveguides, IEEE Photonics Technology Letters, vol. 21, No. 24, Dec. 115, 2009, pp. 1894-1896.

Giuntoni, et al., Numerical Survey on Bragg Reflectors in Silicon-on-Insulator Waveguides, IEEE, ThP14 18.30-20.30 (2008) 285-287.

Handa, et al., Improved Perterbation Analysis of Dielectric Gratings, Appl. Phys. 5, 325-325.(1975).

Irace, et al, All-silicon optoelectronic modulator with 1 GHz switching capability, Electronics Letters 23d, Jan. 2003, vol. 39, No. 2, pp. 232-233.

Jiang, et al., Slab-Modulated Sidewall Bragg Grating in Silicon-on-Insulator Ridge Waveguides, IEEE Photonics Letters, vol. 23, No. 1, Jan. 1, 2011, pp. 6-8.

Kim, et al., Resonant waveguide device with vertical gratings, Mar. 1, 2007/vol. 32, No. 5/Optics Letters, pp. 539-541.

Murphy, et al., Fabrication and Characterization of Narrow-Band Bragg Reflection Filters in Silicon-on-Insulator Ridge Waveguides, Journal of Lightwave Technology (2001) pp. 1938-1942.

Streifer, et al., Coupling Coefficients for Distributed Feedback Single- and Double-Heterostructure Diode Lasers, IEEE Journal of Quantum Electronics, vol. QE-11, No. 11, Nov. 1975, pp. 867-873.

Tan, et al., Cladding-Modulated Bragg Gratings in Silicon Waveguides, 2009 OSA/CLEO/IQEC, pp. 1-2.

Tan, et al., Wavelength selective coupler on silicon for applications in wavelength division multiplexing, IEEE, MD4.4 16.45-17.00 (2010) 203-204.

Yariv, et al., Coupled-Mode Theory for Guided Wave Optics, IEEE Journal of Quantum Electronics, vol. QE-9, No. 9, Sep. 1973, pp. 919-933.

Yariv, et al., Periodic Structures for Integrated Optics, IEEE Journal of Quantum Electronics, Apr. 1977, pp. 234-253.

* cited by examiner

REDUCTION OF MODE HOPPING IN A LASER CAVITY

RELATED APPLICATIONS

This application claims the benefit of U.S. Provisional Patent Application Ser. No. 61/627,584, filed on Oct. 14, 2011, entitled "Reduction of Mode Hopping in Laser Cavity," and incorporated herein in its entirety.

FIELD

The present invention relates to optical devices and more particularly to devices having a laser cavity.

BACKGROUND

Lasers are commonly used as the source of light signals in optical communications systems. These lasers are often integrated onto optical chips and/or onto optoelectronic chips. The laser cavities in these lasers often include a partially reflective optical grating positioned at one end of the laser cavity. These gratings are configured to transmit a portion of the light signal generated in the cavity and to return another portion of the light signal to the cavity. The returned portion of the light signal amplifies and is later transmitted by the grating as the laser output. These gratings are generally configured to reflect light in a very narrow range of wavelengths in order to limit the laser output to a single wavelength or to a single mode.

One of the challenges with these lasers is mode hopping. Mode hopping refers to the light signal produced by one of these lasers changing from one mode to another. The change between modes is associated with an undesirable change in the wavelength of the light signal output by the laser. The mode hopping can be a result of influences that change the index of refraction of the media through which the light signals are guided during amplification. Examples of influences that can cause these effects are temperature changes and/or changes in the level of electrical current applied to the media through which the light signals are guided. In order to address these problems, many of these devices include temperature control devices and/or other feedback control devices for stabilizing the indices of refraction of the media through which the light signals are guided. These temperature control devices and/or other feedback control devices increase the complexity and/or cost of the device.

SUMMARY

The laser cavity is positioned on a substrate and includes a cavity waveguide guiding a laser light signal between a gain medium and a partial return device. The partial return device receives the laser light signal from the cavity waveguide and returns a first portion of the laser light signal to the cavity waveguide. The partial return device transmits a second portion of the laser light signal to an output waveguide. The partial return device reflects different wavelengths of the laser light signal at different intensities. Additionally, the partial return device is configured such that when the most intense wavelength of the laser light signal reflected by the partial return device is the same as a wavelength of one of modes of the laser light signal, the mode with the next longest wavelength and the mode with the next shortest wavelength are each reflected by the partial return device at an intensity greater than 30% of the intensity of the most intensely reflected wavelength. In some instances, the mode with the next longest wavelength and the mode with the next shortest wavelength are each reflected by the partial return device at an intensity greater than 50%, 60%, 70%, or 90% of the intensity of the most intensely reflected wavelength.

BRIEF DESCRIPTION OF THE FIGURES

FIG. 4A is a topview of the multi-channel device.

FIG. 4B is a cross section of the cavity waveguide shown in FIG. 4A taken along the line labeled B.

FIG. 4C is a cross section of the multi-channel device shown in FIG. 4A taken along a line extending between the brackets labeled C in FIG. 4A.

FIG. 4D is a cross section of the multi-channel device shown in FIG. 4A taken along a line extending between the brackets labeled D in FIG. 4A.

DESCRIPTION

The optical device includes a laser cavity formed on a substrate. The laser cavity includes a gain medium in which a laser light signal is generated. The laser cavity also includes a partial return device that receives the laser light signal from the gain medium. The partial return device returns a first portion of the laser light signal to the gain medium and transmits a second portion of the laser light signal. The returned portion of the laser light signal is amplified and is later transmitted through the partial return device as the laser output.

The partial return device reflects different wavelengths at different intensities. The partial return device has a broader reflection profile than prior devices. For instance, the partial return device is configured to provide substantial levels of reflection for multiple different modes of the laser light signal where prior partial return devices were configured to provide substantial reflection of a single mode. Broadening of the reflection profile of the optical grating causes a re-distribution of power between multiple modes rather than hopping of power between two modes. For instance, the average wavelength of the light signal output from the waveguide shows smaller changes in response to changes in the index of refraction of the media through which the laser light signal is guided. As a result, the output light signal is less responsive to external effects such as changes in temperature and applied current. Accordingly, the need for temperature control devices and/or other feedback control devices is eliminated.

Figure 1:
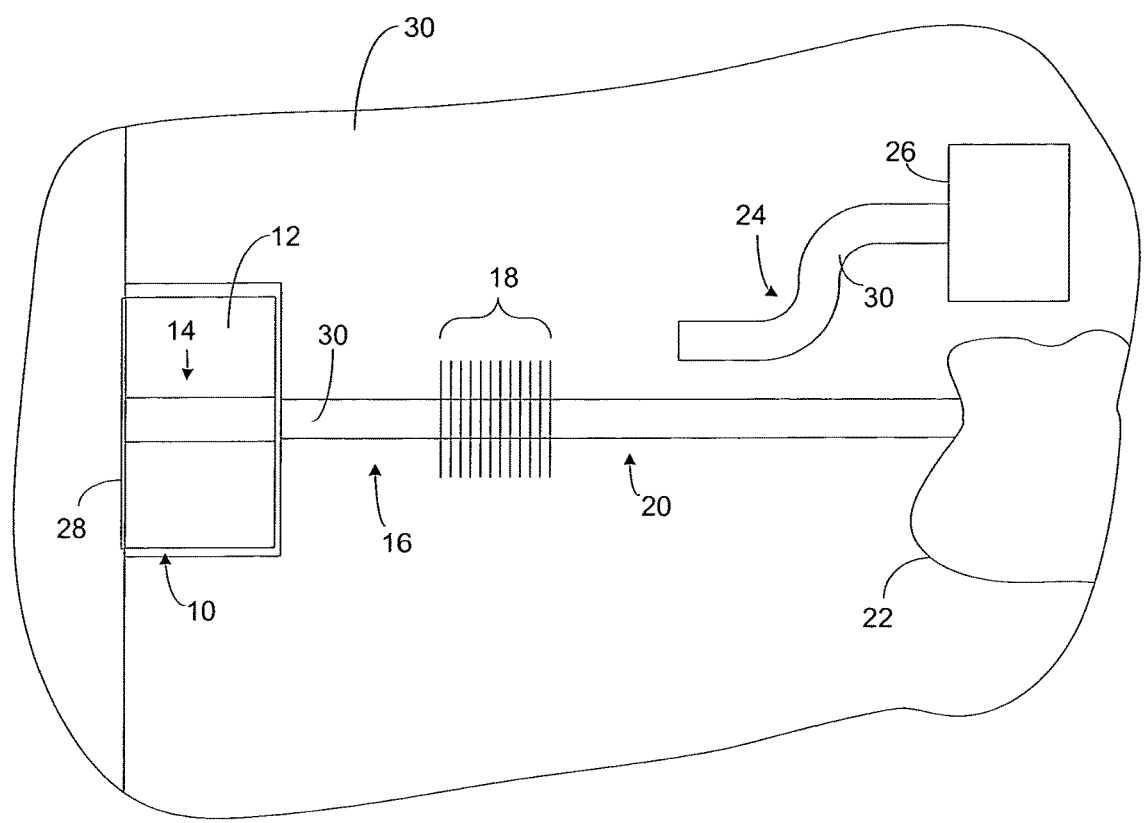
FIG. 1 is a topview of an optical device that includes a laser cavity.

FIG. 1 is a topview of an optical device having a laser cavity that includes a gain element 10. While certain features of the gain element 10 are not shown in FIG. 1, the gain element 10 includes a gain medium 12 that is shown in FIG. 1. A gain waveguide 14 is defined in the gain medium 12. A cavity waveguide 16 provide an optical pathway from the gain waveguide 14 to a partial return device 18. An output waveguide 20 provides an optical pathway from the partial return device 18 to optical components 22 included on the device. The optical components 22 are optional and, in some instances, the output waveguide 20 terminates at a facet located centrally on the device or at an edge of the device so the device can be connected to an optical fiber. Examples of suitable optical components 22 include, but are not limited to, demultiplexers, multiplexers, filters, switches, amplifiers, star couplers, optical fibers, circulators, optical attenuators, etc.

A coupled waveguide 24 may optionally be optically coupled with the output waveguide 20 such that a portion of the output light signal is coupled into the coupled waveguide 24. The coupled waveguide 24 guides the tapped portion of the output light signal to a light sensor 26. The light sensor 26 is configured to convert the received light signal to an electrical signal. Electronics (not shown) can be in electrical communication with the light sensor 26 and can receive the electrical signal from the light sensor 26. In some instances, the electronics are also in electrical communication with the gain element 10. For instance, the electronics can apply electrical energy to the gain element 10.

During operation of the device, the cavity waveguide 16 carries a laser light signal from the gain medium 12 to the partial return device 18. The partial return device 18 returns a first portion of the laser light signal along its original path and permits a second portion of the laser light signal to enter the output waveguide 20. As a result, the second portion of the laser light signal serves as the light signal output by the laser.

The cavity waveguide 16 carries the first portion of the laser light signal back to the gain waveguide 14. The gain waveguide 14 guides the received first portion of the laser light signal through the gain medium 12 to a reflector 28. The reflector 28 reflects the laser light signal portion such that the first laser light signal portion returns to the gain waveguide 14 and eventually to the partial return device 18. Accordingly, the first laser light signal portion travels through the gain waveguide 14 twice before returning to the partial return device 18. The gain medium 12 in combination with the multiple passes of the laser light signal through the gain medium 12 are the source of optical gain in the laser. Energy can be applied to the gain medium 12 to provide the optical gain. In some instance, the energy is electrical energy provided by the electronics but other forms of energy can be used. The reflector 28 can be highly reflective so substantially all of the first laser light signal portion that is incident on the reflector 28 is returned to the gain waveguide 14.

During the generation of the output light signal, the electronics receive the electrical signal from the light sensor 26. The electronics can also adjust the level of electrical energy applied to the gain element 10 in response to the electrical signal received from the light sensor 26 in a feedback loop. For instance, in the event that the electrical signal from the light sensor 26 indicates that the intensity of the output light signal is above a threshold, the electronics can reduce the electrical energy applied to the gain medium 12 in order to reduce the intensity of the output light signal.

Figure 2A:
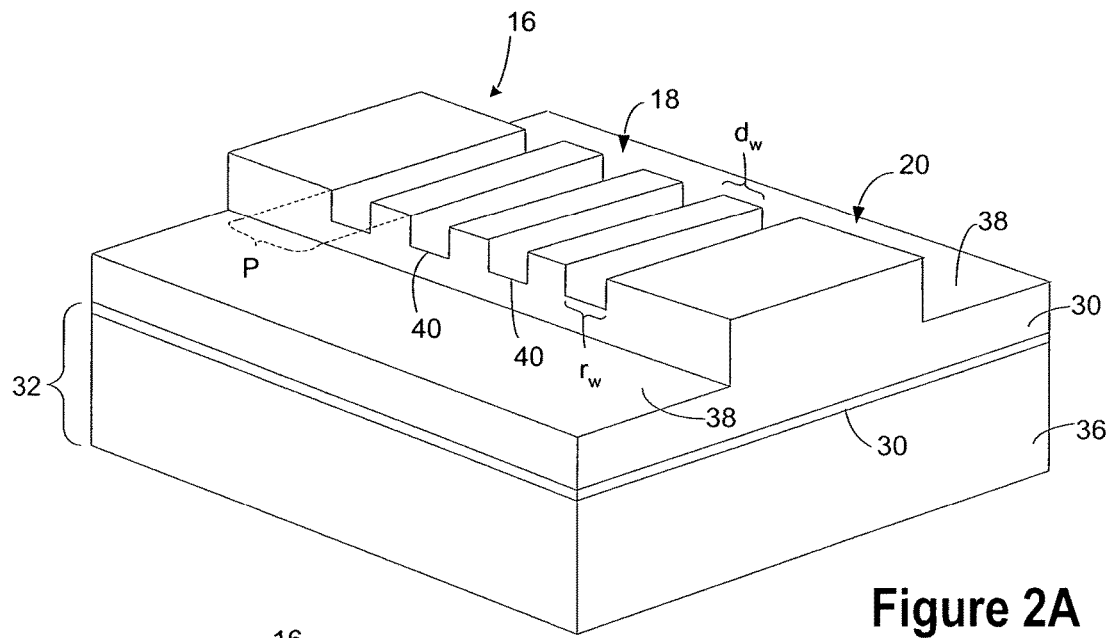
FIG. 2A shows a portion of a device constructed according to FIG. 1. The portion of the device shown in FIG. 2A includes a Bragg grating that serves as a partial reflection device. The Bragg grating includes recesses extending into a top of a ridge waveguide.

A suitable partial return device 18 is a reflective optical grating such as a Bragg grating. FIG. 2A shows a portion of a device constructed according to FIG. 1. The portion of the device shown in FIG. 2A includes a Bragg grating that serves as the partial reflection device. The device includes a light-transmitting medium 30 positioned on a base 32. The portion of the base 32 adjacent to the light-transmitting medium 30 is configured to reflect light signals from the light-transmitting medium 30 back into the light-transmitting medium 30 in order to constrain light signals in the light-transmitting medium 30. For instance, the portion of the base 32 adjacent to the light-transmitting medium 30 can be an optical insulator 34 with a lower index of refraction than the light-transmitting medium 30. The drop in the index of refraction can cause reflection of a light signal from the light-transmitting medium 30 back into the light-transmitting medium 30. Suitable light-transmitting media include, but are not limited to, silicon, polymers, silica, SiN, GaAs, InP and LiNbO$_3$.

The base 32 can include the optical insulator 34 positioned on a substrate 36. As will become evident below, the substrate 36 can be configured to transmit light signals. For instance, the substrate 36 can be constructed of a second light-transmitting medium 30 that is different from the light-transmitting medium 30 or the same as the light-transmitting medium 30. The illustrated device is constructed on a silicon-on-insulator wafer. A silicon-on-insulator wafer includes a silicon layer that serves as the light-transmitting medium 30. The silicon-on-insulator wafer also includes a layer of silica positioned on a silicon substrate 36. The layer of silica can serve as the optical insulator 34 and the silicon substrate 36 can serve as the substrate 36.

The illustrated portion of the device shows a Bragg grating at an interface between the cavity waveguide 16 and the output waveguide 20. A ridge of the light-transmitting medium 30 extends outward from slab regions 38 of the light-transmitting medium 30. The ridge partially defines each of the waveguides. For instance, the ridges and the base 32 together define a portion of a light signal-carrying region where light signals are constrained within each of the waveguides. When the device is constructed on a silicon-on-insulator wafer, the silica that serves as the insulator 34 has an index of refraction that is less than an index of refraction of the silicon light-transmitting medium 30. The reduced index of refraction prevents the light signals from entering the substrate 36 from the silicon. Different waveguides on the device can have different dimensions or the same dimensions.

Recesses 40 extend into the top of the ridge. The recesses 40 are filled with a medium having a lower index of refraction than the light-transmitting medium 30. The medium can be a solid or a gas such as air. Accordingly, the recesses 40 provide the variations in the index of refraction of the waveguide that allow the recesses 40 to act as a Bragg grating. The Bragg grating is illustrated with only four recesses 40 in order to simplify the illustration. However, the Bragg grating can include more than four recesses 40. The recesses 40 are arranged so as to form a periodic pattern in the ridge. The period is labeled P in FIG. 2A.

Figure 2B:
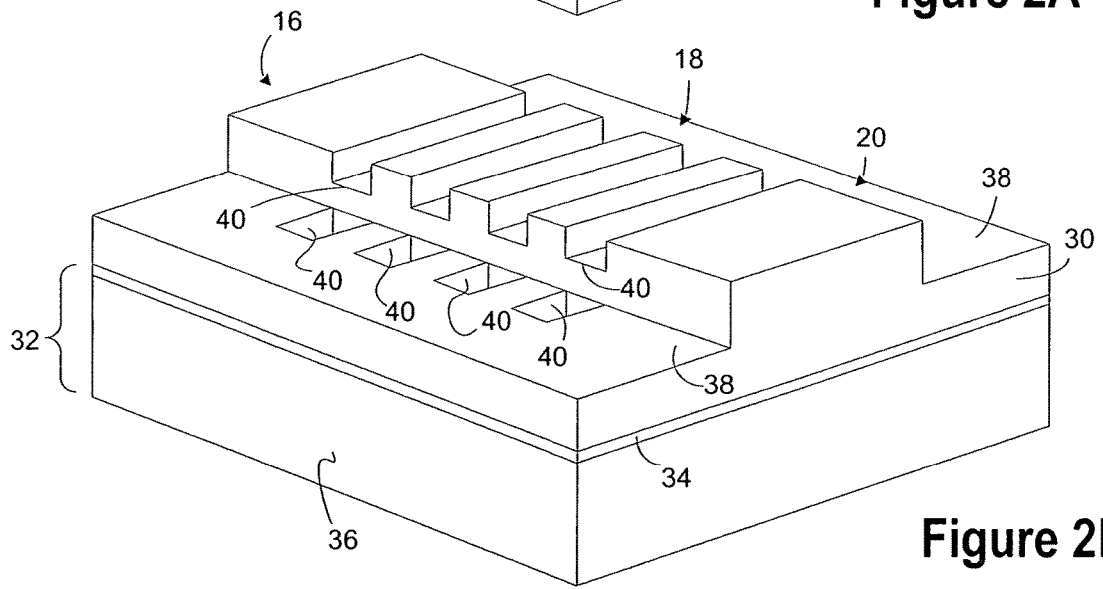
FIG. 2B shows a portion of a device constructed according to FIG. 1. The portion of the device shown in FIG. 2B includes a Bragg grating that serves as a partial reflection device. The Bragg grating includes recesses extending into a top of a ridge waveguide and also into slab regions adjacent to the ridge.
Figure 2C:
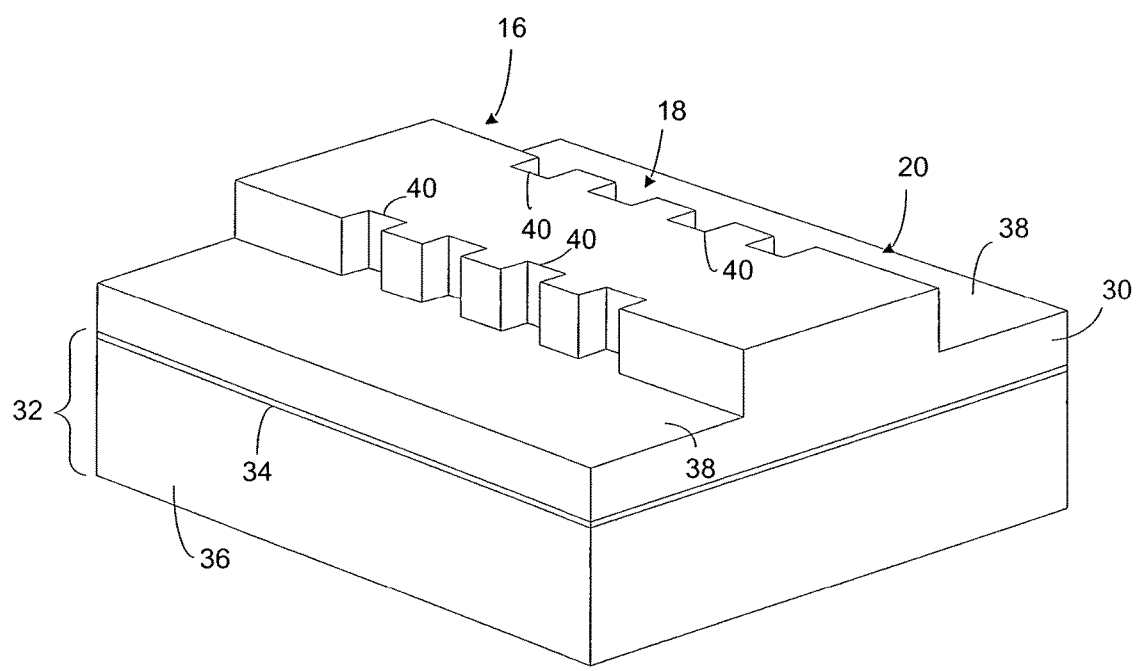
FIG. 2C shows a portion of a device constructed according to FIG. 1. The portion of the device shown in FIG. 2C includes a Bragg grating that serves as a partial reflection device. The Bragg grating includes recesses extending into the lateral sides of a ridge waveguide.

The recesses 40 need not extend only into top of the ridge. For instance, the recesses 40 can also extend into the slab regions 38 of the light-transmitting medium 30 as shown in FIG. 2B. Although FIG. 2B shows the recesses extending into the slab regions 38 of the light-transmitting medium 30 on one side of the ridge, the recesses can extend into the slab regions 38 of the light-transmitting medium 30 on both sides of the ridge. Alternately, the recesses 40 can extend into one or both of the lateral sides of the ridge as shown in FIG. 2C. The recesses 40 can also be combinations of the above arrangements. For instance, the recesses 40 can extend into the lateral sides of the ridge and also the into the slab regions 38 of the light-transmitting medium 30. Alternately, each recess 40 can extend into top of the ridge, into the lateral sides of the ridge and also the into the slab region 38 of the light-transmitting medium 30.

Figure 3A:
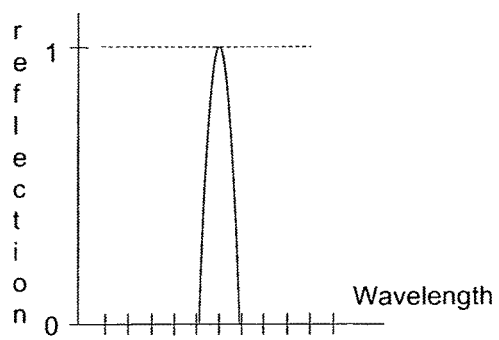
FIG. 3A shows a reflection profile for a Bragg Grating.

A reflective grating transmits a portion of an incident light signal and reflects another portion of the incident light signal. FIG. 3A shows a reflection profile for a Bragg Grating. The Bragg grating reflects different wavelengths of light at different intensities. In particular, the y-axis of FIG. 3A shows the intensity of light that the Bragg grating reflects at the wavelength shown on the x-axis. Although the y-axis of FIG. 3A is in units of intensity, another way to understand the reflection profile is in terms of percentages. For instance, the y-axis of the reflection profile can represent the percentage of incident light that the Bragg grating reflects when the light has the wavelength shown on the x-axis.

The Bragg grating does not reflect 100% of any wavelength. As a result, the wavelengths that are substantially returned to the laser cavity amplify and are then transmitted by the Bragg grating as the laser output. In contrast, the wavelengths that are about 100% transmitted by the Bragg grating are not returned to the laser cavity. Accordingly, these wavelengths are not amplified and are not substantially present in the output light signal. As a result, the wavelengths that the Bragg grating reflects more strongly have a higher intensity level in the output light signal.

Figure 3B:
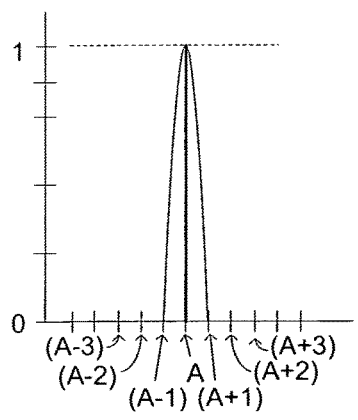
FIG. 3B shows the reflection profile of FIG. 3A normalized by the intensity of the most intensely reflected wavelength. Additionally, the different modes of the reflected light signal are labeled on the x-axis.
Figure 3C:
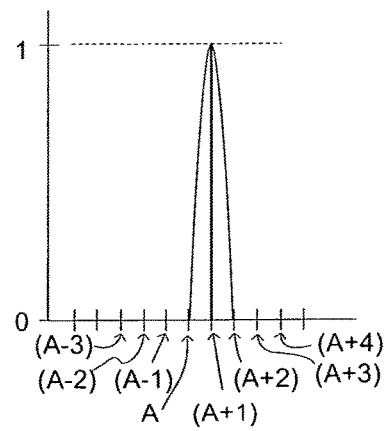
FIG. 3C shows the reflection profile of FIG. 3B after shifting of the reflection profile.

FIG. 3B and FIG. 3C show the reflection profile of FIG. 3A normalized by the intensity of the most intensely reflected wavelength. As a result, the value of the y-axis at the peak of the reflection profile is 1. Accordingly, the units associated with the y-axis can represent relative intensity in that the intensity is a percent of the intensity at the peak of the reflection profile.

The laser light signal can exist in several different modes. FIG. 3B shows the wavelength of the different modes plotted on the x-axis of FIG. 3A. The wavelengths of the different modes are labeled (A−3) through (A+3). In FIG. 3B, the peak in the reflection profile is located at the wavelength of mode A. However, changes in temperature and/or applied current can change the index of refraction of the gain waveguides 14 and/or cavity waveguide 16. These changes cause the reflection profile for the Bragg grating to shift left and right. For instance, FIG. 3C shows the reflection profile of FIG. 3B shifted so the peak in the reflection profile is located at the wavelength of mode A+1. In a Bragg grating having the reflection profile of FIG. 3B, the reflected light signal is in mode A; however, in a Bragg grating having the reflection profile of FIG. 3C, the reflected light signal is in mode A+1. As a result, the shift in the reflection profile has caused the reflected light signal to hop from mode A to mode A+1.

Figure 3D:
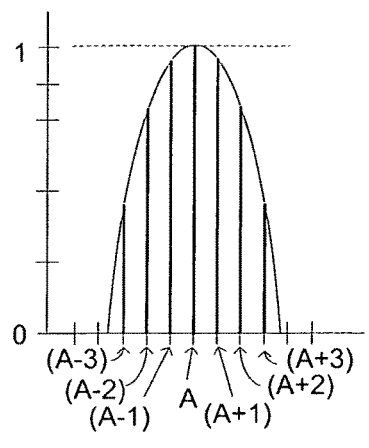
FIG. 3D shows the normalized reflection profile of a Bragg grating having a broader reflection profile than is shown in FIG. 3B.
Figure 3E:
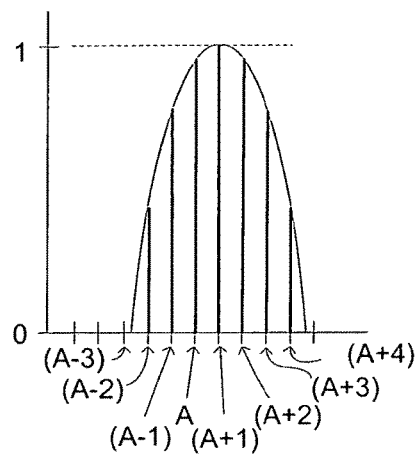
FIG. 3E shows the reflection profile of FIG. 3B after shifting of the reflection profile.

FIG. 3D and FIG. 3E illustrate reflection profiles that are broader than the reflection profiles of prior laser cavity Bragg gratings. The reflection profiles of FIG. 3D and FIG. 3E are normalized by the intensity of the most intensely reflected wavelength. The broadening of the reflection profile reduces the effects of mode hopping. This effect is visible from a comparison of FIG. 3D and FIG. 3E. In FIG. 3D, the relative intensity of mode A is 100%. When the reflection profile shifts an entire mode as seen in FIG. 3E, the relative intensity of mode A only drops to about 90%. This corresponds to a drop of only about 10%. Accordingly, the mode of the reflected signal has not hopped to another mode. Instead, a low level of mode re-distribution occurs despite the reflection profile shifting by an entire mode.

In some instances, the Bragg grating is constructed such that when the peak in the reflection profile occurs at the wavelength of mode (mode A), the relative intensity of mode A+1 and/or mode A−1 are each greater than 40%, 75%, 85%, or 95%. In some instances, the Bragg grating is additionally or alternately constructed such that when the peak in the reflection profile occurs at the wavelength of mode (mode A), the relative intensity of mode A+2 and/or mode A−2 are each greater than 25%, 60%, 70%, or 80%.

The reflection profile of a Bragg grating can be broadened by altering variables of the Bragg grating along the length of the Bragg grating. For instance, the depth of the recesses 40 shown in any of FIG. 2A through FIG. 2C can be varied along the length of the Bragg grating. As a result, in some instances, the Bragg grating has an inconsistent recess depth along the length of the Bragg grating. Additionally or alternately, the period can be varied along the length of the Bragg grating. As a result, in some instances, the Bragg grating has an inconsistent period along the length of the Bragg grating.

Another variable that can affect the width of the reflection profile is the ratio of rw:dw. As shown in FIG. 2A, rw represents a width of the recess 40 while dw represents the width of the ridge between the recesses 40. As a result, in some instances, the Bragg grating has an inconsistent ratio of rw:dw along the length of the waveguide.

In some instances, the reflection profile of the grating can be broadened by varying more than two variables along the length of the grating. For instance, both the period and depth can be varied along the length of the grating.

The device can be constructed using traditional integrated circuit manufacturing techniques. For instance, the ridges for waveguides can be formed by masking and etching. The recesses 40 in the ridge and/or slab regions 38 can be formed by masking and etching. When recess 40 features with small dimensions are desired, reactive ion etching can be performed. The light sensor 26 can be a conventional photodetector such as a photodiode. Alternately, the light sensor 26 can be constructed as shown in U.S. patent application Ser. No. 12/804,769, filed Jul. 28, 2010, and entitled "Light Monitor Configured to Tap Portion of Light Signal from Mid-Waveguide;" and/or in U.S. patent application Ser. No. 12/803,136, filed Jun. 18, 2010, and entitled "System Having Light Sensor with Enhanced Sensitivity;" and/or in U.S. patent application Ser. No. 12/799,633, filed Apr. 28, 2010, and entitled "Optical Device Having Partially Butt-Coupled Light Sensor;" and/or in U.S. patent application Ser. No. 12/589,501, filed Oct. 23, 2009, and entitled "System Having Light Sensor with Enhanced Sensitivity;" and/or in U.S. patent application Ser. No. 12/584,476, filed Sep. 4, 2009, and entitled "Optical Device Having Light Sensor Employing Horizontal Electrical Field;" each of which is incorporated herein in its entirety.

Figure 4A:
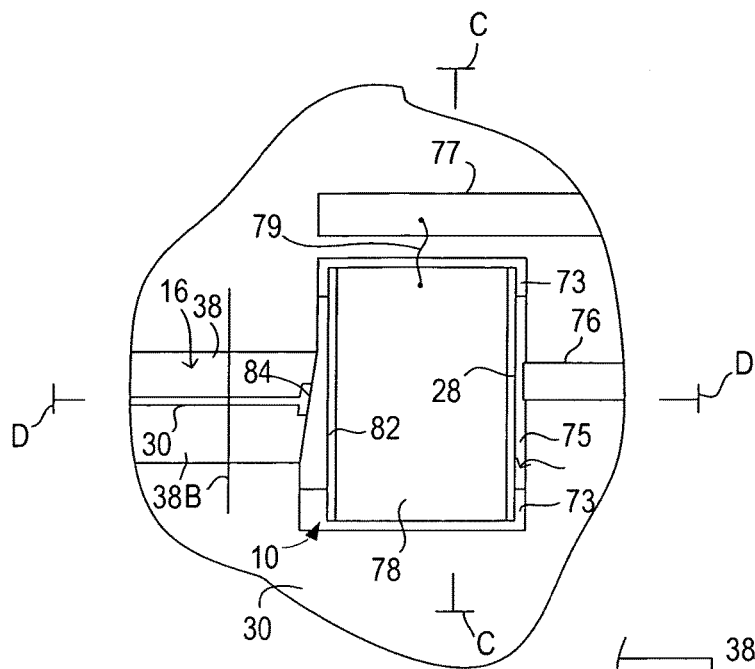
FIG. 4A through FIG. 4D illustrate the portion of a multi-channel device having an interface between a cavity waveguide and a gain element.
Figure 4B:
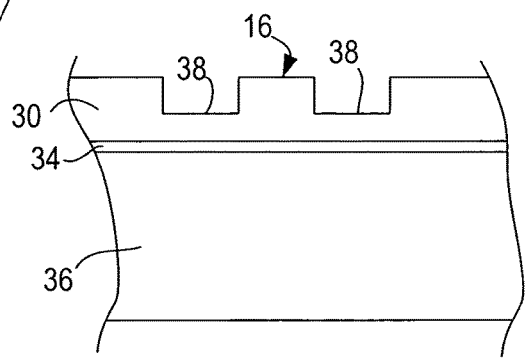
Figure 4C:
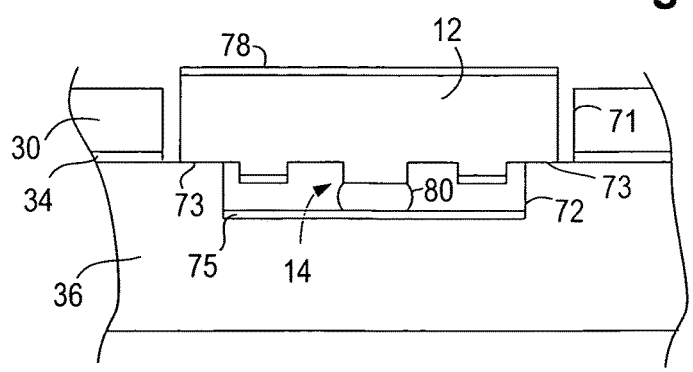
Figure 4D:
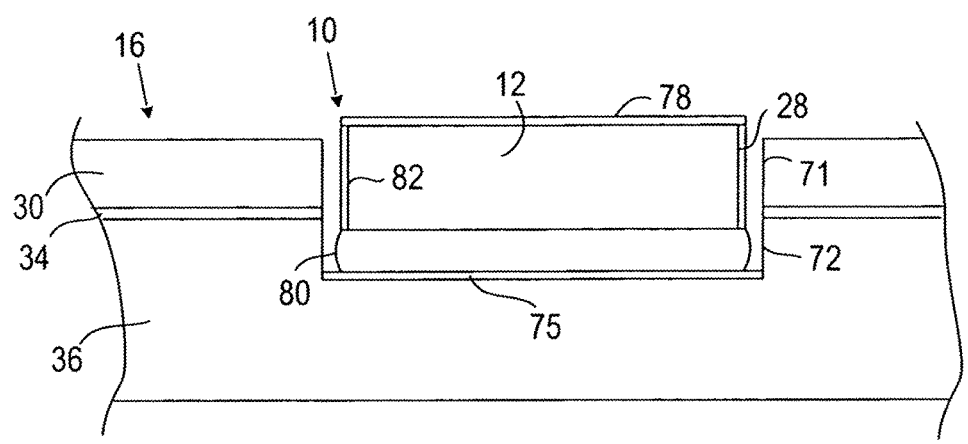

FIG. 4A through FIG. 4D illustrates a device having a gain element 10 interfaced with a cavity waveguide 16 shown in FIG. 1. The device is constructed on a silicon-on-insulator wafer. FIG. 4A is a topview of the device. FIG. 4B is a cross section of the device shown in FIG. 4A taken along the line labeled B. The line labeled B extends through the cavity waveguide 16 disclosed in FIG. 1. Accordingly, FIG. 4B is a cross section of the cavity waveguide 16. FIG. 4C is a cross section of the multi-channel device shown in FIG. 4A taken along a line extending between the brackets labeled C in FIG. 4A. FIG. 4D is a cross section of the multi-channel device shown in FIG. 4A taken along a line extending between the brackets labeled D in FIG. 4A.

A first recess 71 extends through the silicon light-transmitting medium 30 and the silica insulator 34. A second recess 72 extends into the bottom of the first recess 71 such that the silicon substrate 36 forms shelves 73 in the bottom of the second recess 72. A first conducting layer 75 is positioned in the bottom of the second recess 72. A first conductor 76 on the silicon slab is in electrical communication with the first conducting layer 75. A second conductor 77 on the silicon slab is positioned adjacent to the first recess 71.

A gain element 10 is positioned in the first recess 71 and rests on the shelves 73. The gain element 10 includes a gain medium 12. A second conducting layer 78 is positioned on the gain medium 12. A third conductor 79 provides electrical communication between the second conducting layer 78 and the second conductor 77.

Three ridges extend into the second recess 72. The outer-most ridges have a passivation layer. The central ridge defines a portion of the gain waveguide 14 and is in electrical communication with the first conducting layer 75. The electrical communication between the central ridge and the first conducting layer 75 can be achieved through a conducting medium 80 such as solder. Since the first conductor 76 is in electrical communication with the first conducting layer 75, the first conductor 76 is in electrical communication with the central ridge.

The beam of light can be generated from the gain medium 12 by causing an electrical current to flow through the gain medium 12. The electrical current can be generated by applying a potential difference between the first conductor 76 and the second conductor 77. The potential difference can be provided by the electronics. The electronics can be included on the device or can be separate from the device but electrically coupled with the device.

The gain element 10 includes a reflecting surface on the gain medium 12. The reflecting surface can serve as the reflector 28 of FIG. 1. Suitable reflecting surfaces include a layer of metal on the layer of gain medium 12. The side of the gain medium 12 opposite the reflecting surface optionally includes an anti-reflective coating 82. The beam of light exits the gain medium 12 through the anti-reflective coating 82. Suitable anti-reflective coatings 82 include, but are not limited to, single-layer coatings such as silicon nitride or aluminum oxide, or multilayer coatings which may contain silicon nitride, aluminum oxide, and/or silica.

As is evident from FIG. 4A, the facet 84 for the cavity waveguide 16 can be angled at less than ninety degrees relative to the direction of propagation in the cavity waveguide 16. Angling the facet 84 at less than ninety degrees can cause light signals reflected at the facet 84 to be reflected out of the waveguide and can accordingly reduce issues associated with back reflection. Additionally or alternately, a facet of the gain waveguide can be angled at less than ninety degrees relative to the direction of propagation in the gain waveguide.

Suitable gain elements 10 include, but are not limited to, InP chips. The electrical communication between the second conducting layer 78 and the second conductor 77 can be achieved using traditional techniques such as wire bonding. The electrical communication between the central ridge and the first conductor 76 can be achieved through traditional techniques such as solder bonding.

Although FIG. 1 shows the gain element 10 positioned at an edge of the device, the gain element 10 can be located centrally on the device as shown in FIG. 4A through FIG. 4D.

EXAMPLE 1

An optical device having a first laser cavity according to FIG. 1 was constructed on a silicon-on-insulator wafer. The partial return device was configured such that the most intensely reflected adjacent mode is reflected at about 35% of the intensity of the most intensely reflected mode. The adjacent modes are the modes that have the next longest wavelength (mode A+1) and the mode with the next shortest wavelength (mode A−1) when compared to wavelength of the most intensely reflected mode.

Figure 5A:
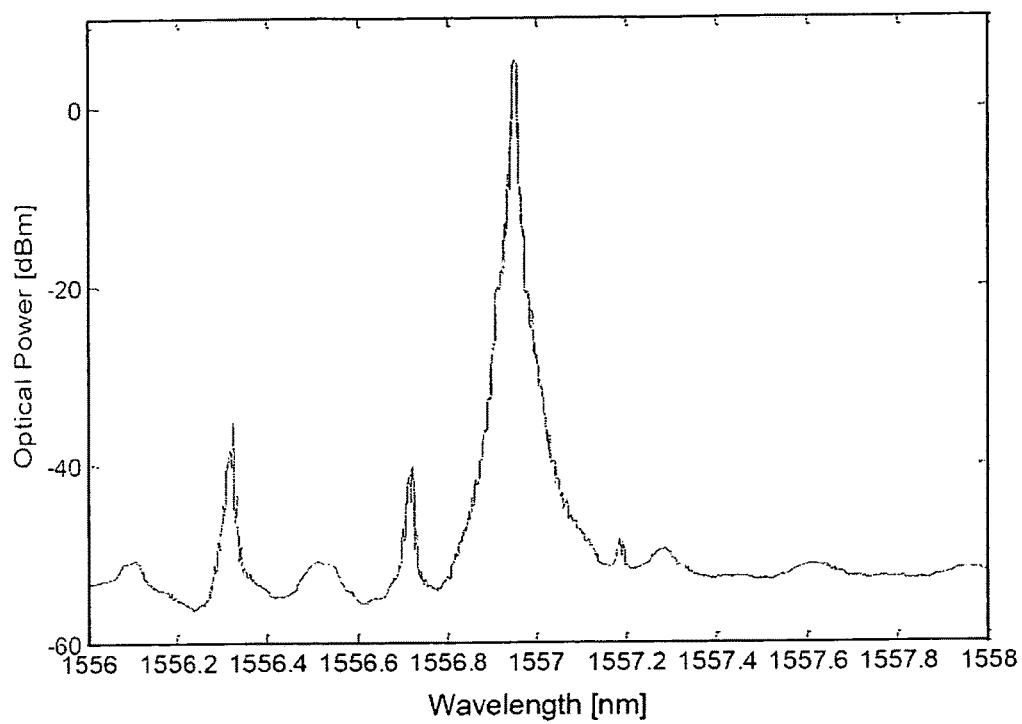
FIG. 5A is an output power versus wavelength plot for a laser cavity constructed according to FIG. 1A.

The output profile for the first laser is present in FIG. 5A. The mode with the most intense wavelength output by the laser cavity is shown at a wavelength of 1556.95 nm. The mode with the next shortest wavelength is shown at a wavelength of 1556.72 nm and has an intensity (or power) of about 45 dB below the most intensely reflected wavelength. As a result, the mode with the next shortest wavelength is output at an intensity of about 0.003% of the intensity of the most intensely output mode.

Figure 5B:
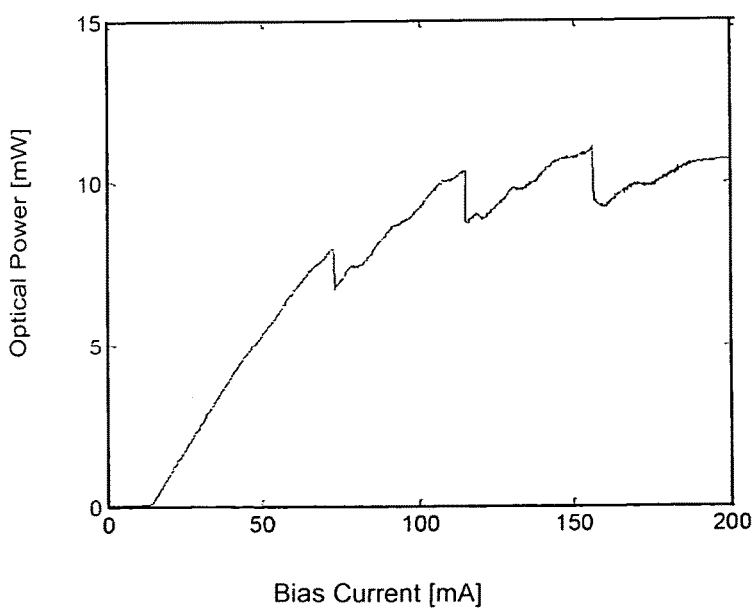
FIG. 5B is a output power versus bias current plot for a laser cavity constructed according to FIG. 1A.

FIG. 5B shows the power of the light signal output from the laser cavity as a function of the bias current applied to the laser cavity. The illustrated curve shows three locations where the output power drops. These drops are a result of mode hopping. As a result, these drops establish the presence of mode hopping the laser cavity.

EXAMPLE 2

An optical device having a second laser cavity according to FIG. 1 was constructed on a silicon-on-insulator wafer. The laser cavity was similar to the first laser cavity of Example 1 but used a partial return was configured such that the most intensely reflected adjacent mode is reflected at about 80% of the intensity of the most intensely reflected mode. The adjacent modes are the modes that have the next longest wavelength (mode A+1) and the mode with the next shortest wavelength (mode A−1) when compared to the wavelength of the most intensely reflected mode.

Figure 6A:
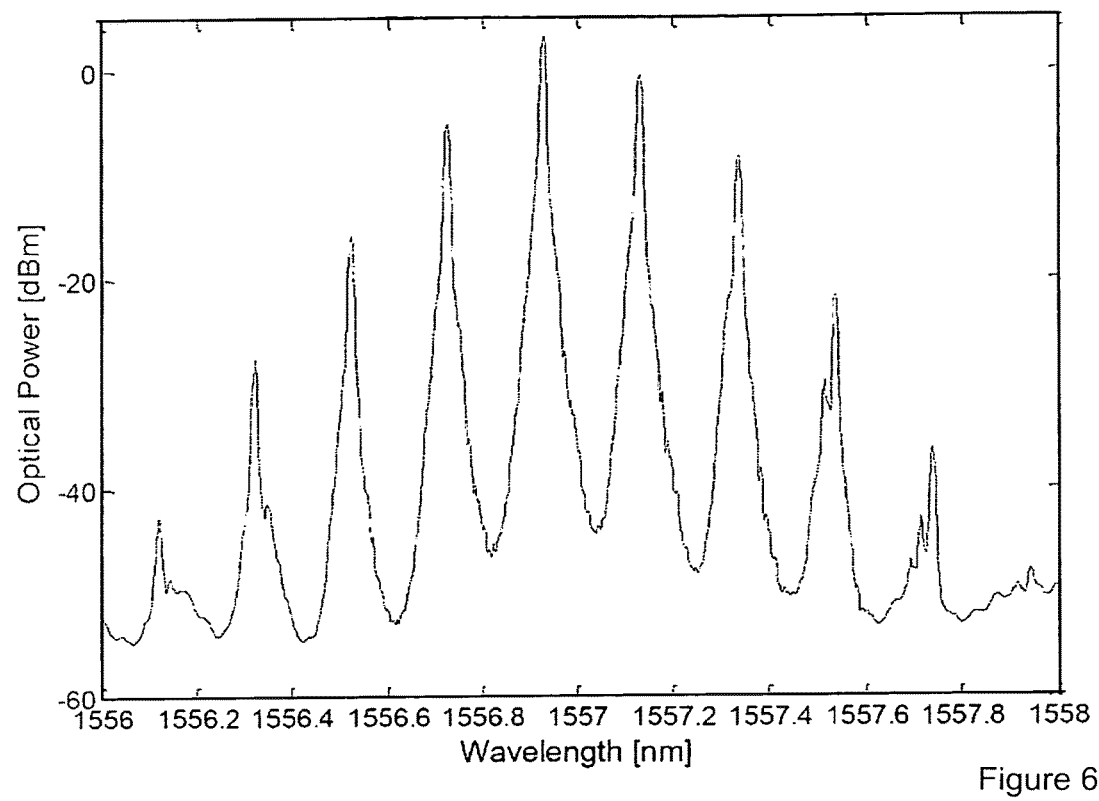
FIG. 6A is an output power versus wavelength plot for a laser cavity constructed according to FIG. 1A.

The output profile for the second laser is present in FIG. 6A. The mode with the most intense wavelength output by the laser cavity is shown at a wavelength of 1556.93 nm. The mode with the next longest wavelength is shown at a wavelength of 1557.13 nm and has an intensity (or power) of about 5 dB below the most intensely reflected wavelength. As a result, the mode with the next shortest wavelength is output at an intensity of about 30% of the intensity of the most intensely output mode.

Figure 6B:
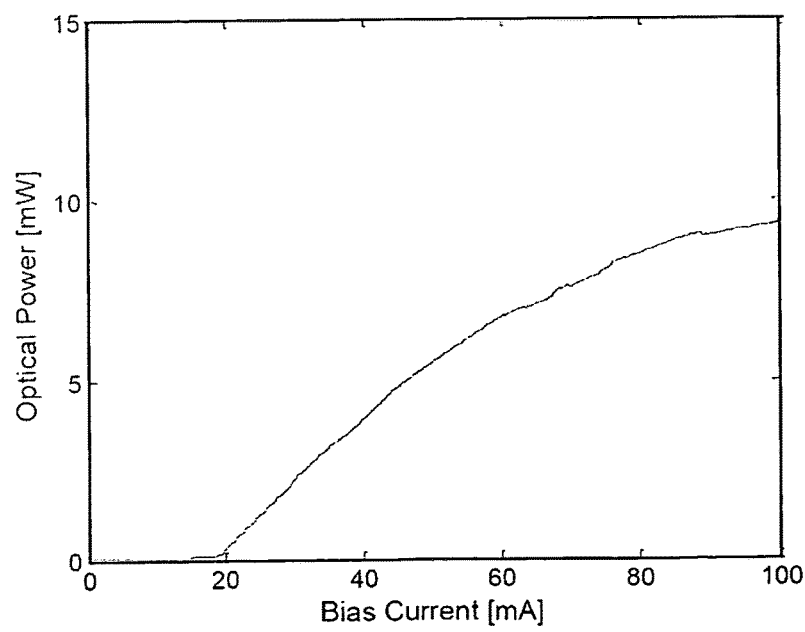
FIG. 6B is a output power versus bias current plot for a laser cavity constructed according to FIG. 1A.

FIG. 6B shows the power of the light signal output from the laser cavity as a function of the bias current applied to the laser cavity. The illustrated curve does not show the drops in output power that are associated with mode hopping the laser cavity. As a result, increasing the intensity at which the adjacent modes above the level of Example 1 has removed the mode hopping from the laser cavity.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An optical device, comprising:
a laser cavity on a substrate, the laser cavity including a gain medium and a partial return device,
the partial return device positioned to receive a laser light signal from the gain medium, the partial return device returning a first portion of the laser light signal to the gain medium and a second portion of the laser light signal exiting from the laser cavity through the partial return device,
the second portion of the laser light signal being an output from the laser cavity and the first portion of the laser light signal including multiple different modes that concurrently lase within the laser cavity,
the partial return device reflecting different wavelengths of the laser light signal at different intensities, the reflected intensity of a particular wavelength being the percentage of the incident light at the particular wavelength that is reflected by the partial return device, and
the partial return device configured to have a reflection profile that is sufficiently broad that when the most intense wavelength reflected by the partial return device is the same as a wavelength of one of the modes, the mode with the next longest wavelength and the mode with the next shortest wavelength are each reflected by the partial return device at an intensity greater than 40% and less than 90% of the intensity of the most intensely reflected wavelength.

2. The device of claim 1, wherein the partial return device is a Bragg grating.

3. The device of claim 1, wherein the mode with the second longest wavelength and the mode with the second shortest wavelength are each reflected by the partial return device at an intensity greater than 65% of the intensity at which the first mode is transmitted.

4. The device of claim 1, wherein a cavity waveguide guides the laser light signal between the gain medium and the partial return device.

5. The device of claim 4, wherein the waveguide is partially defined by a ridge of a light-transmitting medium extending upward from slab regions of the light-transmitting medium.

6. The device of claim 5, wherein the light-transmitting medium and the substrate are each silicon.

7. The device of claim 4, wherein the partial return device is a result of periodically spaced variations in the index of refraction of the waveguide.

8. The device of claim 7, wherein the waveguide is configured to guide the laser light signal through a light-transmitting medium and the variations in the index of refraction of the waveguide are a result of recesses in the light-transmitting medium.

9. The device of claim 1, wherein the waveguide is configured to guide the laser light signal through a light-transmitting medium and the partial return device includes multiple recesses in the light-transmitting medium.

10. The device of claim 9, wherein a separation between different recesses changes along a length of the partial return device.

11. The device of claim 9, wherein a period changes along a length of the partial return device, the period being a distance that starts at a left side of a recess and moves right to the left side of the next recess.

12. The device of claim 9, wherein a depth that each recess extends into the light-transmitting medium changes along a length of the partial return device.

13. The device of claim 9, wherein the recesses extend into a top of a ridge of the light-transmitting medium, the ridge of the light-transmitting medium extending upward from slab regions of the light-transmitting medium.

14. The device of claim 13, wherein secondary recesses extend into the slab regions of the light-transmitting medium, each secondary recess being aligned vertically with one of the recesses extend into the top of the ridge.

15. The device of claim 9, wherein the recesses extend into lateral sides of a ridge of the light-transmitting medium, the ridge of the light-transmitting medium extending upward from slab regions of the light-transmitting medium.

16. The device of claim 1, wherein the laser light signal concurrently exists in multiple different modes.

17. The device of claim 1, wherein the gain medium receives the first portion of the laser light signal such that the first portion of the laser light signal travels through the gain medium and the first portion of the laser light signal includes multiple different modes.

18. The device of claim 1, wherein a cavity waveguide guides the laser light signal between the gain medium and the partial return device and
the laser light signal concurrently exists in multiple different modes.

19. The device of claim 1, wherein the second portion of the light signal does not enter a second laser cavity upon exiting from the laser cavity.

20. The device of claim 1, wherein the mode with the second longest wavelength and the mode with the second shortest wavelength are each reflected by the partial return device at an intensity less than 80% of the intensity at which the first mode is transmitted.

* * * * *